United States Patent [19]
Farnworth et al.

[11] Patent Number: 5,910,640
[45] Date of Patent: Jun. 8, 1999

[54] ELECTRICAL CONTACT ASSEMBLY FOR USE IN A MULTI-DIE ENCAPSULATION DEVICE

[75] Inventors: Warren M. Farnworth, Nampa; Alan G. Wood; Tim J. Corbett, both of Boise, all of Id.

[73] Assignee: Micron Technology, Inc., Boise, Id.

[ * ] Notice: This patent is subject to a terminal disclaimer.

[21] Appl. No.: 09/026,786

[22] Filed: Feb. 20, 1998

Related U.S. Application Data

[63] Continuation of application No. 08/353,769, Dec. 12, 1994, Pat. No. 5,767,443, which is a continuation-in-part of application No. 08/091,786, Jul. 10, 1993, abandoned.

[51] Int. Cl.⁶ ................................................ H01R 9/09
[52] U.S. Cl. ................................ 174/50; 439/69
[58] Field of Search .................. 174/50, 52.1; 361/728, 361/729, 730, 736, 737, 752, 784, 790, 796, 797; 439/65, 66, 69, 71

[56] References Cited

U.S. PATENT DOCUMENTS

| | | | |
|---|---|---|---|
| 3,500,131 | 3/1970 | Seeley | 361/796 |
| 3,648,113 | 3/1972 | Rathjen et al. | 317/100 |
| 3,760,486 | 9/1973 | Rifkin et al. | 29/278 |
| 3,812,402 | 5/1974 | Garth | 317/100 |
| 3,829,817 | 8/1974 | Beavitt | 339/17 F |
| 4,328,530 | 5/1982 | Bajorek et al. | 361/308 |
| 4,502,100 | 2/1985 | Greenspan et al. | 361/384 |
| 4,645,279 | 2/1987 | Grabbe et al. | 339/17 |
| 4,873,615 | 10/1989 | Grabbe | 361/395 |
| 4,923,404 | 5/1990 | Redmond et al. | 439/71 |
| 4,927,369 | 5/1990 | Grabbe et al. | 439/66 |
| 4,933,808 | 6/1990 | Horton et al. | 361/715 |
| 5,015,191 | 5/1991 | Grabbe et al. | 439/71 |
| 5,104,324 | 4/1992 | Grabbe | 439/62 |
| 5,142,449 | 8/1992 | Littlebury et al. | 361/782 |
| 5,243,757 | 9/1993 | Grabbe et al. | 29/882 |
| 5,528,466 | 6/1996 | Lim et al. | 361/820 |
| 5,767,443 | 6/1998 | Farnworth et al. | 174/50 |

OTHER PUBLICATIONS

"AMP Product Specification", *PIB 65559*, AMP Inc., Harrisburg, PA 17105, (Issued Jan. 1993).

*Primary Examiner*—Dean A. Reichard
*Attorney, Agent, or Firm*—Schwegan, Lundberg, & Woessner & Kluth, P.A.

[57] ABSTRACT

A multi-die encapsulation device has a plurality of die chambers. Each of the die chambers has parallel opposing walls, retaining edges which define an insertion void, and a retaining contact in contact with a printed circuit board. Each of the retaining contacts is characterized as having a compliant foot for making contact with a printed circuit board. The encapsulation device comprises a cap with a compression pad for protecting and biasing each of the bare die in its respective chamber.

7 Claims, 4 Drawing Sheets

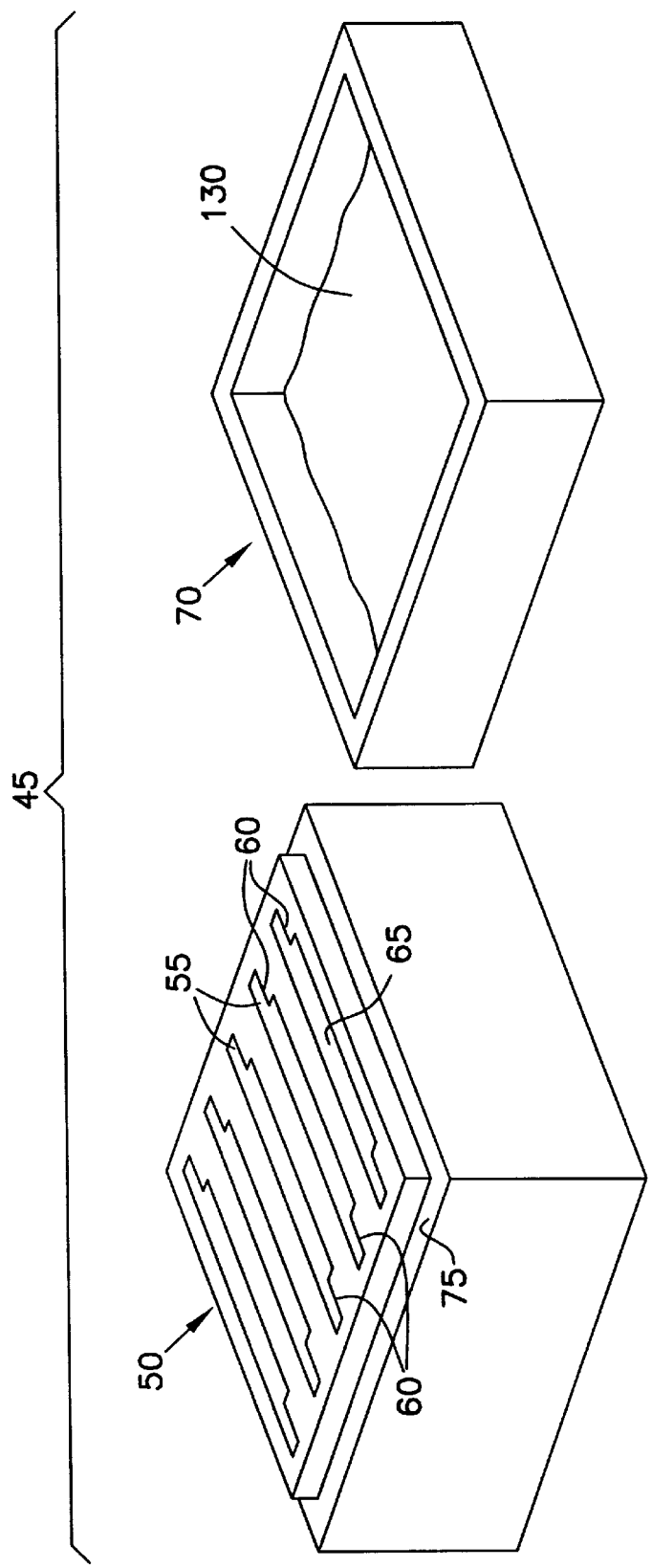

ELECTRICAL CONTACT ASSEMBLY FOR USE IN A MULTI-DIE ENCAPSULATION DEVICE

This application is a continuation of U.S. patent application Ser. No. 08/353,769, filed Dec. 12, 1994, now U.S. Pat. No. 5,767,443, which is a continuation-in-part of the Application having Ser. No. 08/091,786 filed on Jul. 10, 1993, now abandoned and entitled A Multi-Die Encapsulation Device and Method and having inventors Warren M. Farnworth, Alan G. Wood, and Tim J. Corbett.

FIELD OF THE INVENTION

The present invention relates to packaging of semiconductor integrated circuits, and more particularly to a multi-die encapsulation device.

BACKGROUND OF THE INVENTION

AMP Corporation located Harrisburg, Pa. has developed an encapsulation device for retaining a plurality of bare semiconductor die. A cross sectional view of a simplified AMP encapsulation device is shown in FIG. 1. The AMP encapsulation device is typically molded plastic and has a chamber portion comprised of a plurality of die chambers 5 and is enclosed with a cap after the insertion of the die into the chambers 5. Each chamber has at least one beveled edge 10. A bare die is inserted by hand into a chamber 5 with the circuit side touching the beveled edge 10. The beveled edge 10 thus serves as a guide for the insertion of the bare die. However, since the circuit slides across the bevel the circuitry may be damaged during insertion. The bare die is inserted into a spring retaining and contact assembly 15. The retaining and contact assembly 15 holds the bare die in position in the encapsulation device. A spring portion 20 electrically contacts the bare die and a rigid foot portion 25 is provided for contacting a circuit board onto which the encapsulation device is mounted. Due to the rigidity of the foot portion 25 and inherent bowing of many circuit boards the failure rate of electrical contact between the bare die and the board is typically high. At times the failure runs as high as 80%. In addition to these problems solid caps secured over the chamber portion of the encapsulation device do not retain the die in the correct position and often are a cause of die damage subsequent to encapsulation of the die.

Thus a need exists for an encapsulation device for bare die which provides reliable electrical contact between the die and a mounting board and a need exists for a method for safely inserting the bare die into the encapsulation device. In addition there is a need to provide position retainment of the bare die within the encapsulation device without fear of die damage following encapsulation.

SUMMARY OF THE INVENTION

The invention is an encapsulation device for bare die. The encapsulation device comprises chambers having parallel walls, an insertion void, and a spring retention electrical contact having a compliant foot and comprises a cap having a compression pad. The encapsulation device of the invention provides a reliable contact between the die and a mounting board via the compliant foot. The insertion void allows for a safe insertion of a die into a chamber of the encapsulation device. The compression pad and the spring retention electrical contact provide positive retainment of the bare die within the encapsulation device.

The invention is a process for inserting bare die into the encapsulation device of the invention and is a vacuum insertion tool used in the insertion of the bare die into the encapsulation device.

BRIEF DESCRIPTION OF THE DRAWINGS

FIG. 2 is three dimensional view of the encapsulation device of the invention prior to insertion of bare die and prior to final assembly.

DETAILED DESCRIPTION OF THE INVENTION

Figure 1:
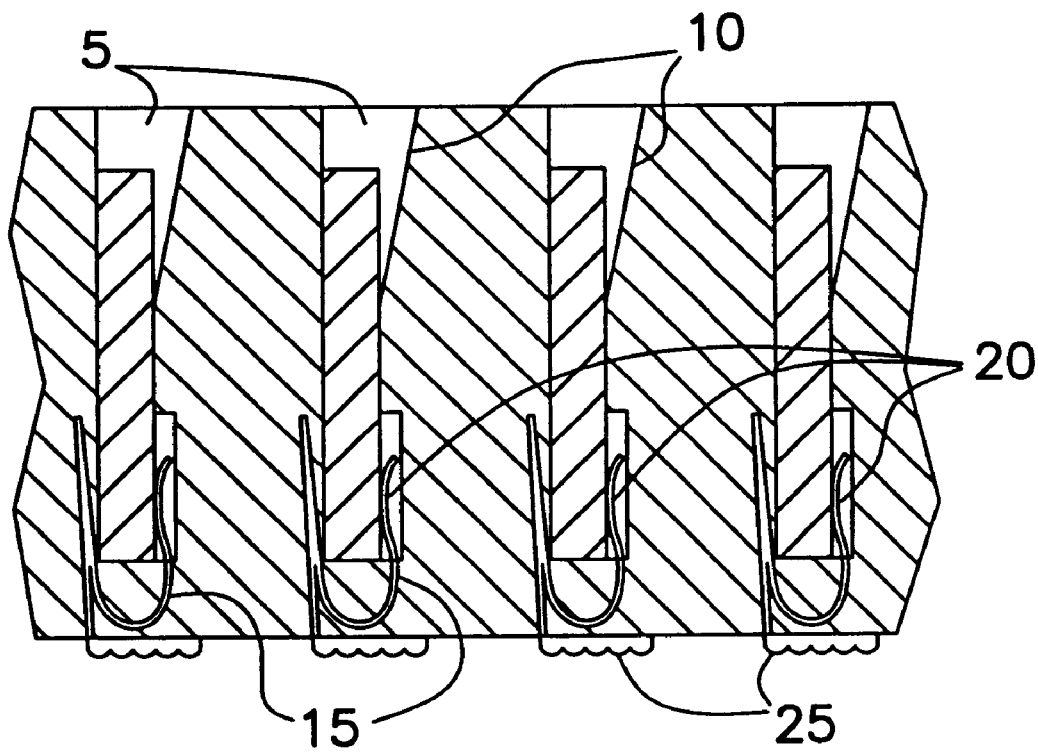
FIG. 1 is a simplified AMP encapsulation device of the related art.

FIG. 2 is a three dimensional view of the encapsulation device 45 of the invention prior to insertion of bare die into the encapsulation device. A chamber portion 50 comprises a plurality of chambers 55 for accepting and retaining the bare die. The exact number of chambers 55 may vary depending on design considerations. Each chamber 55 comprises retaining edges 60 which define a chamber void 65. The chamber void 65 accepts a bare die insertion tool during the process of inserting the bare die into each chamber 55.

When the bare die have been inserted into the chambers 55 a cap 70 is sealed to the chamber portion. The cap 70 rests on lip 75 of the chamber portion 50. The final locking seal between the cap 70 and the lip 75 is typically an epoxy which when heated allows the cap to be removed and resealed, thereby allowing for the removal and the replacement of faulty die. However, other locking seals such as a snap seal, a grooved seal, and a pressure seal, may work equally well. The chamber portion 50 and the cap 70 are typically molded plastic.

Figure 3:
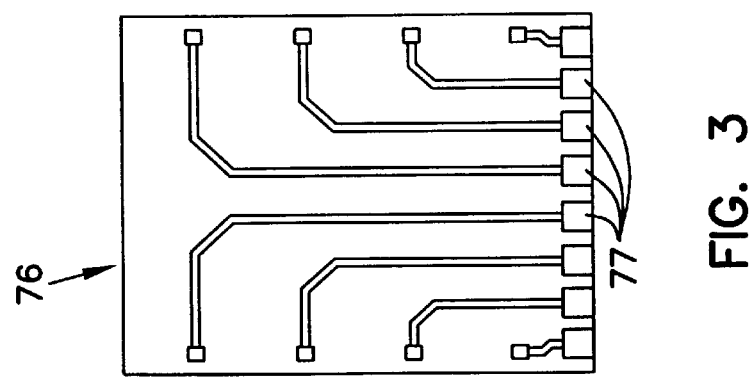
FIG. 3 is simplified schematic of a bare die and the die pads thereon.

FIG. 3 is representative of a single bare die 76 designed to fit into the encapsulation device 45. In this case the single die 76 has eight die pads 77 although it is possible for the bare die to have any number of die pads.

Figure 4:
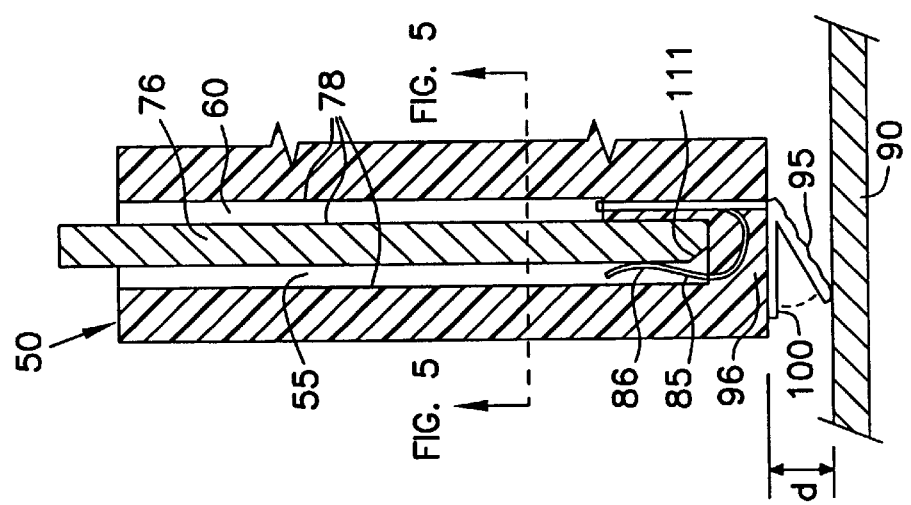
FIG. 4 is a cross sectional view of one chamber of the encapsulation device of the invention with a bare die inserted and seated therein.

FIG. 4 is a cross sectional view of a single die chamber 55 having parallel walls 78. A bare die 76 inserted into the die chamber 55 is retained against the retaining edges 60 by retaining contact 85. The retaining contact 85 and electrical contacts one of the die pad 77 of bare die 76, see FIG. 3, at a spring portion 86 and electrically contacts a circuit board 90 with a compliant foot portion 95 when seated in the die chamber 55. Thus the retaining contact protrudes through a bottom portion 96 of the chamber portion 50. The compliant contact foot 95 provides reliable contact to the circuit board 90 even though the circuit board 90 may be bowed. It can be seen from FIG. 3 that the compliant foot 95 has a vertical displacement d. Therefore as long as the distance between the reference foot 100 and the circuit board 90 is less than d and the distance accommodates a width of the compliant foot 95 the compliant foot 95 makes contact with the circuit board 90. The number of retaining contact 85 is equal to the number of die pads 77 on the bare die 76. Therefore for the bare die of FIG. 2 there would be eight retaining contact 85 in a die chamber 55.

Figure 5:
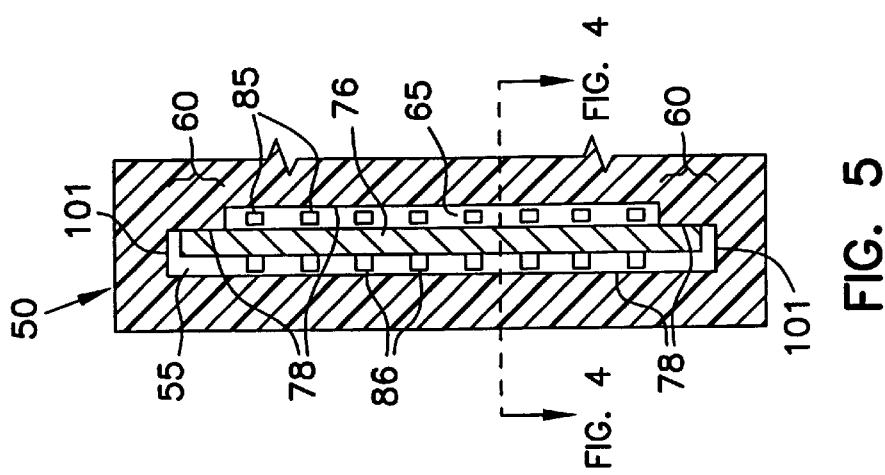
FIG. 5 is a top view of one chamber of the encapsulation device of the invention with a bare die inserted therein.

FIG. 5 is a top view of a single die chamber 55. In addition to elements previously named a pair of opposed parallel walls 101 is shown in FIG. 5. Preferably, the chamber portion 50 shown in FIG. 1 is oriented, during bare die insertion, such that the chambers 55 are stacked. This orientation allows for a simplified insertion process which can best be understood with reference to FIGS. 3, 4, 5, 6, and 7.

Figure 6:
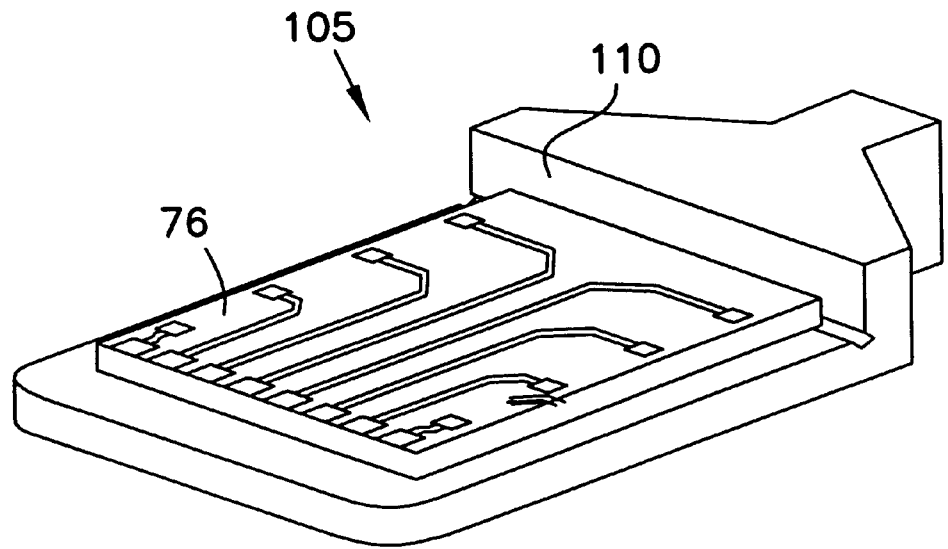
FIG. 6 is a three dimensional view of a bare die insertion tool of the invention.
Figure 7:
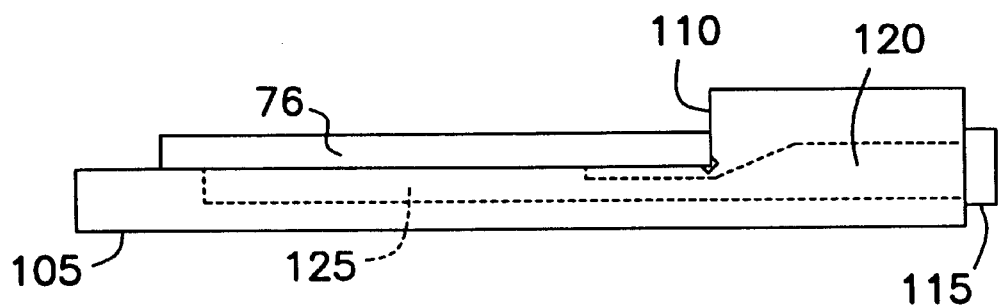
FIG. 7 is a side view of the three dimensional view of the bare die insertion tool of FIG. 6.

A bare die 76 is placed on an insertion tool 105, shown three dimensionally in FIG. 6 and cross sectionally in FIG. 7, with the circuit side of the bare die 76 up, thereby preventing damage to the circuitry of the bare die 76. The insertion tool 105 is then inserted into the chamber void 65 between the two retaining edges 60. The guide edge 110 of the insertion tool 105 is used to mechanically force the bare die 76 into the retaining contact 85, see FIG. 4. For best results a bare die 76 with a beveled edge 111 is used to eliminate breakage as the bare die 76 is forced into the retaining contact 85, again see FIG. 4. The bare die 76 is held in a correct orientation on the insertion tool 105 with a vacuum provided by a vacuum source, not shown. The vacuum source is connected to the insertion tool 105 at vacuum connection 115 through a means such as a plastic hose, not shown.

Internal passages 120 connected to the vacuum connection 115 directs the vacuum to suction depressions 125. Thus the die insertion tool 105 allows for insertion of the bare die 76 into chamber 55 without damage to die circuitry. Not only does the process and encapsulation device of the invention prevent damage to die circuitry there is also a space savings over the beveled wall chamber of the related art shown in FIG. 1.

However it should also be noted that the exact orientation of the parallel chamber walls is unimportant. For example they may be at an angle of less than 90 degrees to the circuit board to which the encapsulated device attaches. In this case the chambers may be slanted to form a low profile encapsulation device.

After the bare die 76 have been inserted into the desired chambers 55 the cap 70 is seated on lip 75, see FIG. 1, and retained and sealed to the chamber portion 50 with a sealant glue. The cap contains a compression pad 130 which provides a flexible bias to the bare die 76. Various substances may be used for the compression pad including a variety of springs, gels, or foams. Because of the flexible bias the compression pad 130 biases the bare die firmly into the retaining contact. Therefore the compression pad 130 of the cap 70 helps to eliminate breakage of the bare die even with jarring. The seating of the cap 70 on the lip 75 completes the encapsulation process.

Although the invention has been described with respect to specific embodiments the invention is limited only as claimed.

What is claimed is:

1. An electrical contact, comprising:
   a) a retention portion configured to engage a first workpiece and to at least partially engage said first workpiece in a generally fixed position and to establish electrical communication with said workpiece; and
   b) a compliant foot portion attached to said retention portion, said compliant foot portion capable of movement from a first position to a second position, wherein said retention portion and said complaint foot portion are electrically conductive and are in electrical communication one with the other.

2. An electrical contact, comprising:
   a) a retention portion configured to engage a first workpiece and at least partially retain said first workpiece in a generally fixed position and to establish electrical communication with said workpiece; and
   b) a compliant foot portion attached to said retention portion, said compliant foot portion capable of movement from a first position to a second position, said compliant foot portion maintaining contact with a second workpiece when the second workpiece biases said compliant foot portion at a position at or between the first and the second positions, said compliant foot portion for contacting an electrical connection of the second workpiece when biased by the second workpiece, wherein said retention portion and said complaint foot portion are electrically conductive and have electrical continuity one with the other.

3. The electrical contact as specified in claim 2, further comprising an electrically insulative member against which said first workpiece is retained, said electrically insulative member providing a positioning edge for the first workpiece.

4. The electrical contact as specified in claim 2, further comprising a stationary reference foot attached to said compliant foot portion, wherein said compliant foot portion is biased from said first position toward said reference foot.

5. An electrical contact assembly, comprising:
   a) a retention assembly comprising a generally U-shaped contact assembly, said contact assembly having a resilient movable electrical contact, at least a portion of said electrical contact configured to electrically contact a desired element; and
   b) a foot portion assembly coupled to said retention assembly in movable relation thereto.

6. A connector assembly for providing electrical contact between first and second circuit elements, comprising:
   a) a receiving member defining a channel configured to receive at least a portion of said first circuit element, at least one contact member operably associated with said receiving member, said contact member having a generally resilient portion configured to selectively engage and ensure electrical contact with said first circuit element when it is received within said receiving member; and
   b) a resilient foot portion mechanically and electrically coupled to said contact member and configured to mount in resilient relation therewith, said foot portion coupled to resiliently electrically contact said second circuit element.

7. The connector assembly as specified in claim 6, wherein said contact member forms one side of a generally U-shaped assembly, and wherein said U-shaped assembly is configured to receive said first circuit element.

* * * * *